(12) United States Patent
Yamazaki et al.

(10) Patent No.: US 12,376,273 B2
(45) Date of Patent: Jul. 29, 2025

(54) BULK FEEDER AND PARTS SUPPLY CONTROL SYSTEM

(71) Applicant: FUJI CORPORATION, Chiryu (JP)

(72) Inventors: Yusuke Yamazaki, Chiryu (JP); Toshihiro Nonomura, Toyota (JP); Yuji Kawasaki, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 135 days.

(21) Appl. No.: 18/262,476

(22) PCT Filed: Jan. 29, 2021

(86) PCT No.: PCT/JP2021/003419
§ 371 (c)(1),
(2) Date: Jul. 21, 2023

(87) PCT Pub. No.: WO2022/162914
PCT Pub. Date: Aug. 4, 2022

(65) Prior Publication Data
US 2024/0076134 A1    Mar. 7, 2024

(51) Int. Cl.
*H05K 13/02* (2006.01)
*B65G 27/32* (2006.01)
*B65G 47/16* (2006.01)
*H05K 13/04* (2006.01)

(52) U.S. Cl.
CPC ........... *H05K 13/028* (2013.01); *B65G 27/32* (2013.01); *B65G 47/16* (2013.01); *H05K 13/043* (2013.01)

(58) Field of Classification Search
CPC .... H05K 13/028; H05K 13/043; B65G 27/24; B65G 27/26; B65G 27/36; B65G 47/14; B65G 27/32
See application file for complete search history.

(56) References Cited

U.S. PATENT DOCUMENTS

| | | | | |
|---|---|---|---|---|
| 6,661,189 B2* | 12/2003 | Yagi | ....... | B65G 27/32 318/128 |
| 6,753,640 B2* | 6/2004 | Kato | ....... | B65G 27/24 310/331 |

(Continued)

FOREIGN PATENT DOCUMENTS

| | | |
|---|---|---|
| JP | 2002-128261 A | 5/2002 |
| JP | 4134075 B2 | 8/2008 |
| JP | 2010-67907 A | 3/2010 |

(Continued)

OTHER PUBLICATIONS

International Search Report mailed on Apr. 13, 2021 in PCT/JP2021/003419 filed on Jan. 29, 2021.

*Primary Examiner* — Gene O Crawford
*Assistant Examiner* — Keith R Campbell
(74) *Attorney, Agent, or Firm* — Oblon, McClelland, Maier & Neustadt, L.L.P.

(57) ABSTRACT

A bulk feeder includes a feeder main body, a track member provided vibratably with respect to the feeder main body and formed with a conveyance path through which multiple components are conveyed, an excitation device configured to apply vibration to the track member so that the multiple components are conveyed along the conveyance path, and a vibration sensor configured to detect a vibration value indicating a vibration state of the track member that vibrates by the excitation of the excitation device.

8 Claims, 6 Drawing Sheets

(56) References Cited

U.S. PATENT DOCUMENTS 6,763,934 B2 * 7/2004 Nakamura ............. B65G 27/32
198/769
2002/0105772 A1 8/2002 Yagi

FOREIGN PATENT DOCUMENTS

| JP | 2010067907 A | * | 3/2010 |
| JP | 2011-88707 A | | 5/2011 |
| JP | 2011-114084 A | | 6/2011 |
| JP | 2013-252961 A | | 12/2013 |

* cited by examiner

BULK FEEDER AND PARTS SUPPLY CONTROL SYSTEM

TECHNICAL FIELD

The present disclosure relates to a bulk feeder and a component supply control system.

BACKGROUND ART

A component supply control system controls component supply using a bulk feeder. The bulk feeder is provided in a component mounter that mounts a component on a board, and supplies the component in a bulk state. Patent Literature 1 discloses a configuration for applying vibration to a conveyance path to convey multiple components. By such a conveying operation, the bulk feeder supplies the component in a supply region opened upward so that a suction nozzle can collect the component.

PATENT LITERATURE

Patent Literature 1: JP-A-2011-114084

BRIEF SUMMARY

Technical Problem

Such a bulk feeder is requested to supply components from, for example, a control device of a component mounter, and executes a predefined conveying operation. However, even when the bulk feeder performs an operation, which is set in advance, according to an external command due to a change in an operation environment of the bulk feeder or the like, a good component supply is not always maintained. In addition, in a system for controlling component supply using the bulk feeder, there is a demand for improving productivity by maintaining a good supply state of the component.

An object of the present specification is to provide a bulk feeder capable of acquiring useful information relating to an actual supply operation, and a component supply control system capable of improving a supply state of a component in the bulk feeder and improving productivity of a component mounter provided with the bulk feeder.

Solution to Problem

According to the present specification, there is provided a bulk feeder including: a feeder main body; a track member provided vibratably with respect to the feeder main body and formed with a conveyance path through which multiple components are conveyed; an excitation device configured to apply vibration to the track member so that the multiple components are conveyed along the conveyance path; and a vibration sensor configured to detect a vibration value indicating a vibration state of the track member that vibrates by the excitation of the excitation device.

According to the present specification, there is provided a component supply control system including: a bulk feeder; a frequency specifying section configured to specify a natural frequency of a vibrating body including the track member based on a result detected by the vibration sensor; and a conveyance control section configured to control a conveying operation of the component in the bulk feeder based on a result specified by the frequency specifying section.

Advantageous Effects

With such a configuration, it is possible to acquire useful information relating to an actual supply operation by detecting a vibration value indicating an actual vibration state of the excited track member. In addition, by including such a bulk feeder and controlling the conveying operation based on the natural frequency of the vibrating body including the track member, it is possible to improve the supply state of the component in the bulk feeder. Accordingly, it is possible to improve productivity of a component mounter provided with the bulk feeder.

DESCRIPTION OF EMBODIMENTS

Component supply control system 80 for controlling component supply using bulk feeder 30 will be described with reference to the drawings. Bulk feeder 30 is provided on, for example, component mounter 10 that mounts component 92 on board 91, and supplies component 92 in a bulk state (state where each posture of components 92 is irregular).

1. Configuration of Component Mounter 10

Component mounter 10 makes up a production line for producing a board product together with multiple types of board working machines including, for example, another component mounter 10. The board working machine making up the production line described above can include a printer, an inspection device, a reflow furnace, and the like.

1-1. Board Conveyance Device

Figure 1:
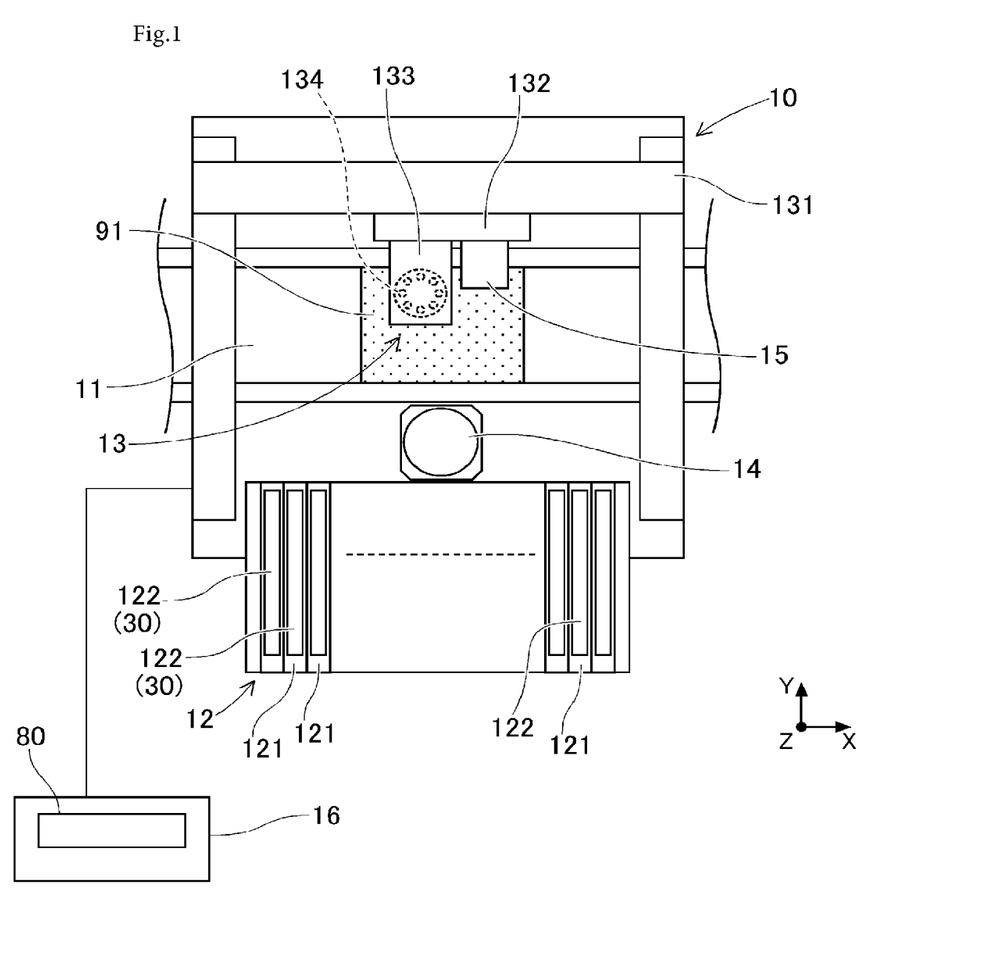
FIG. 1 is a plan view schematically illustrating a component mounter provided with a bulk feeder.

As illustrated in FIG. 1, component mounter 10 includes board conveyance device 11. Board conveyance device 11 subsequently conveys board 91 in a conveyance direction and positions board 91 in a predetermined position in component mounter 10.

1-2. Component Supply Device 12

Component mounter 10 includes component supply device 12. Component supply device 12 supplies components to be mounted on board 91. Component supply device 12 includes feeders 122 which are provided individually in multiple slots 121. A tape feeder, which is configured to feed and move a carrier tape housing, for example, a number of components so as to supply the components to be collected, is applied to feeder 122. In addition, bulk feeder 30 that collectably supplies components accommodated in a bulk state is applied to feeder 122. Details of bulk feeder 30 will be described later.

1-3. Component Transfer Device 13

Component mounter 10 includes component transfer device 13. Component transfer device 13 transfers the component supplied by component supply device 12 onto a predetermined mounting position on board 91. Component transfer device 13 includes head driving device 131, moving body 132, mounting head 133, and suction nozzles 134. Head driving device 131 moves moving body 132 in a horizontal direction (an X-direction and a Y-direction) by a linear motion mechanism. Mounting head 133 is detachably fixed to moving body 132 by a clamp member, not illustrated, and is provided to be movable in the horizontal direction within the mounter.

Mounting head 133 supports multiple suction nozzles 134 in such a manner as to be rotated, and raised and lowered. Suction nozzle 134 is a holding member that collects and holds component 92 supplied by feeder 122. Suction nozzle 134 picks up the component supplied by feeder 122 by supplied negative pressure air. As a holding member to be attached to mounting head 133, a chuck or the like can be adopted which holds the component by gripping the component.

1-4. Part Camera 14 and Board Camera 15

Component mounter 10 includes part camera 14 and board camera 15. Part camera 14 and board camera 15 are digital imaging devices having an imaging element, such as CMOS. Part camera 14 and board camera 15 execute imaging based on control signals and send out image data acquired through the imaging. Part camera 14 is configured to image the component held by suction nozzle 134 from below. Board camera 15 is provided on moving body 132 in such a manner as to be movable in the horizontal direction together with mounting head 133. Board camera 15 is configured to image board 91 from above.

Figure 4:
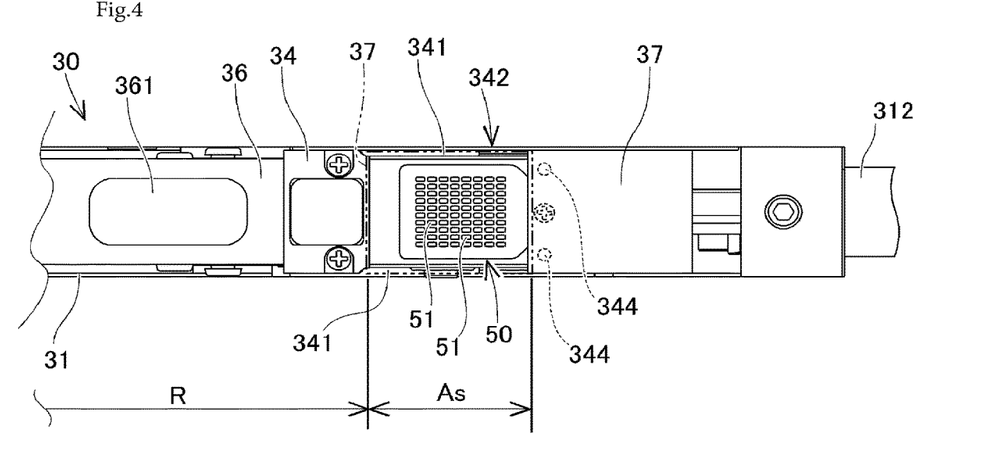
FIG. 4 is a plan view as viewed from an IV direction in FIG. 2.

Board camera 15 can image a front surface of board 91 as an imaging target and can also image various types of devices additionally as imaging targets as long as those devices fall within a movable range of moving body 132. For example, in the present embodiment, as illustrated in FIG. 4, board camera 15 can image supply region As to which bulk feeder 30 supplies component 92 or reference mark 344 provided on the upper portion of bulk feeder 30 in a visual field of the camera. Thus, as described above, board camera 15 can be used commonly to image different imaging targets in order to acquire image data for use in various image processing.

1-5. Control Device 16

As illustrated in FIG. 1, component mounter 10 includes control device 16. Control device 16 mainly includes a CPU, various memories, a control circuit, and a storage device. Control device 16 stores various data such as a control program used for controlling a mounting process in control device 16. The control program denotes mounting positions, mounting angles, and a mounting order of components which are mounted on board 91 in the mounting process.

Control device 16 executes recognition processing of a holding state of the component held by each of multiple holding members (suction nozzles 134). Specifically, control device 16 executes image processing on the image data acquired by the imaging of part camera 14 and recognizes a position and an angle of each component with respect to a reference position of mounting head 133. It should be noted that, in addition to part camera 14, for example, control device 16 may execute the image processing on image data acquired by imaging the component by a head camera unit or the like provided integrally with mounting head 133 from side, below, or above.

Control device 16 controls a mounting operation of the component by mounting head 133 based on the control program to execute the mounting process. Here, the mounting process includes a process of repeating a PP cycle (a pick-and-place cycle) including a collection operation and a mounting operation multiple times. The "collection operation" described above is an operation in which the component supplied by component supply device 12 is collected by suction nozzle 134.

In the present embodiment, control device 16 controls the operation of component supply device 12 including bulk feeder 30 when executing the above-described collection operation. The control targeted for the operation of bulk feeder 30 includes, for example, the supply operation of component 92 by bulk feeder 30, and the control of an opening/closing operation of shutter 37 described later.

Control device 16 includes state recognition section 81. State recognition section 81 recognizes the supply states of multiple components 92 in supply region As of bulk feeder 30 based on the image data acquired by the imaging of the camera (in the present embodiment, board camera 15). The processing for recognizing the supply state includes processing for recognizing whether there is component 92 that can be collected in supply region As, and when there is component 92 that can be collected, recognizing the position and the angle of component 92. Moreover, control device 16 controls an operation of mounting head 133 in the collection operation based on a result of the recognition processing of the supply state.

In addition, the "mounting operation" described above is an operation of mounting the collected component at a predetermined mounting angle in a predetermined mounting position on board 91. In the mounting process, control device 16 controls the operation of mounting head 133 based on information output from various sensors, the result of image processing, a control program, or the like. As a result, the positions and angles of multiple suction nozzles 134 supported by mounting head 133 are controlled.

2. Configuration of Bulk Feeder 30

Bulk feeder 30 is provided on component mounter 10 and functions as a part of component supply device 12. Bulk feeder 30 supplies component 92 accommodated in a bulk state that is not aligned like a carrier tape. Therefore, since bulk feeder 30 does not use a carrier tape unlike the tape feeder, it has a merit in that loading of the carrier tape, collection of the used tape, or the like can be omitted.

Bulk feeder 30 is, for example, of a type that supplies component 92 in an irregular posture to planar supply region As. However, when components 92 are so close to each other or deposited (in a state overlapping in the up-down direction) that components 92 are in contact with each other in supply region As, or when component 92 are in a horizontal posture and a width direction of components 92 is in an up-down direction, component mounter 10 cannot make component 92 as the collection target. Accordingly, in order to increase an amount of components 92 which can be collected, there is a type of bulk feeder 30 that supplies components 92 in an aligned state in supply region As. In the present embodiment, bulk feeder 30 of the type in which components 92 are aligned will be exemplified.

2-1. Feeder Main Body 31

Figure 2:
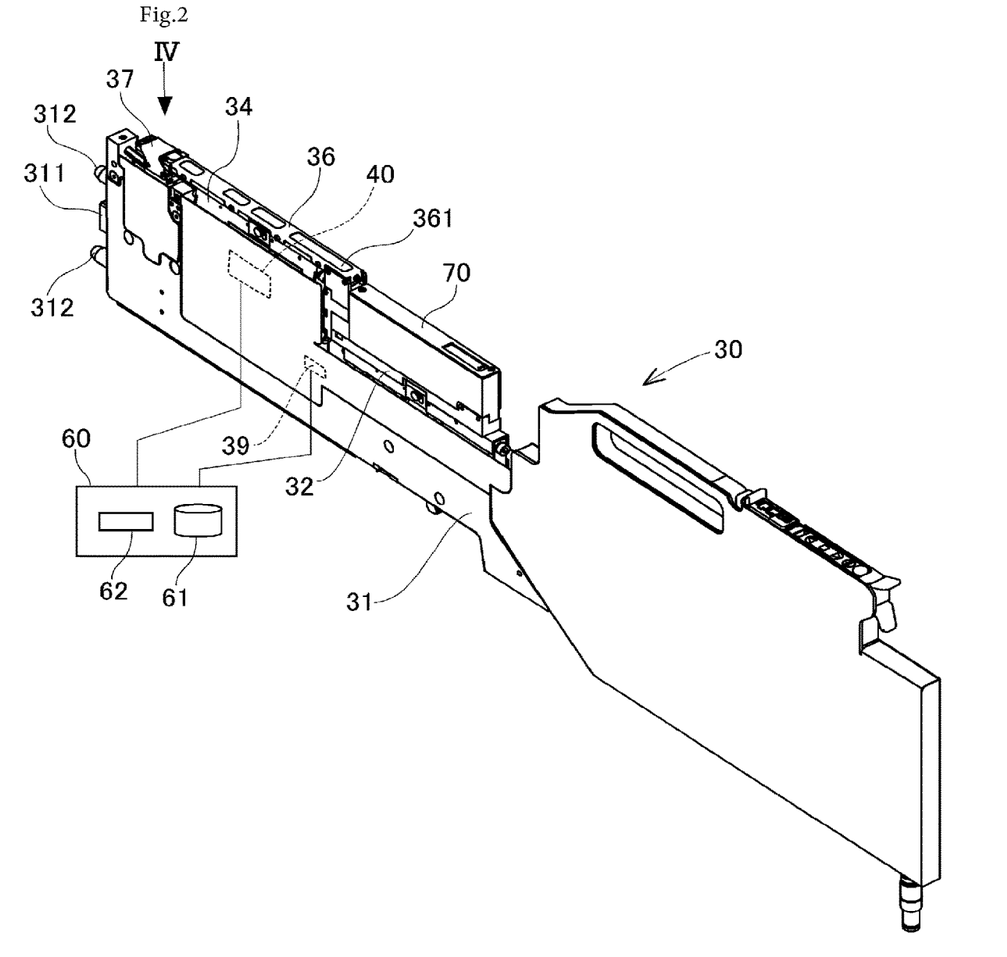
FIG. 2 is a perspective view illustrating an appearance of the bulk feeder.
Figure 3:
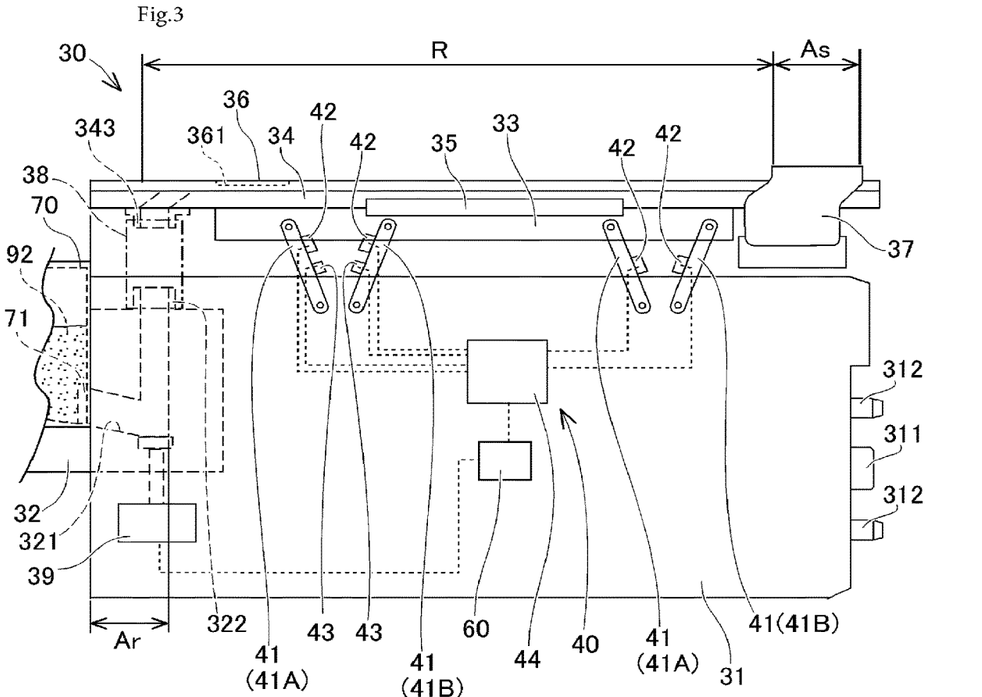
FIG. 3 is a side view schematically illustrating a main part of a bulk feeder.

As illustrated in FIG. 2, bulk feeder 30 includes feeder main body 31 formed in a flat box shape. Connector 311 and two pins 312 are provided at a front portion of feeder main body 31. When feeder main body 31 is set in slot 121 of component supply device 12, power is supplied via connector 311 and communication with control device 16 is enabled. Two pins 312 are inserted into guide holes provided in slot 121, and are used for positioning when feeder main body 31 is set in slot 121.

2-2. Receiving Member 32

Component case 70 for accommodating multiple components 92 in a bulk state is detachably attached to feeder main body 31 via receiving member 32. Component case 70 is an external device of bulk feeder 30. One suitable for the mounting process is selected from various types of component cases 70 and attached to feeder main body 31. Discharge port 71 through which component 92 is discharged to the outside is formed in a front portion of component case 70.

Receiving member 32 is provided vibratably with respect to feeder main body 31, and supports attached component case 70. Receiving member 32 is formed with receiving region Ar for receiving component 92 discharged from component case 70. In the present embodiment, receiving member 32 has inclined portion 321 inclined toward the front side with respect to a horizontal plane in receiving region Ar. Inclined portion 321 is located below discharge port 71 of component case 70 and has a planar shape. Receiving member 32 is formed with a flow path of component 92 extending above receiving region Ar, and feed-out section 322 through which the flow path opens upward is formed.

2-3. Bracket 33, Track Member 34, and Lock Unit 35

Bulk feeder 30 includes bracket 33 and track member 34. Bracket 33 is provided vibratably with respect to feeder main body 31. Bracket 33 is formed in a block shape extending in a front-rear direction of feeder main body 31, and track member 34 is attached to an upper surface of bracket 33. Bracket 33 is supported by support member 41 of excitation device 40 described later. Track member 34 is formed with conveyance path R through which multiple components 92 are conveyed, and supply region As that communicates with conveyance path R and opens upward so as to be able to collect multiple components 92.

Bulk feeder 30 includes lock unit 35. Lock unit 35 locks track member 34 in a state in which track member 34 is attached to bracket 33. When track member 34 is locked by lock unit 35, track member 34 vibrates integrally with bracket 33 with respect to feeder main body 31. Track member 34 is detachable from bracket 33 by unlocking of lock unit 35.

2-4. Detailed Configuration of Track Member 34, Cover 36, Shutter 37, and Connection Member 38

Track member 34 is formed so as to extend in the front-rear direction (left-right direction in FIG. 4) of feeder main body 31. Pair of side walls 341 protruding upward is formed on both edges of track member 34 in the width direction (the up-down direction in FIG. 4). Pair of side walls 341 surround a periphery of conveyance path R together with distal end portion 342 of track member 34, so as to prevent leakage of component 92 conveyed through conveyance path R. Circular reference mark 344 indicating a reference position of supply region As is affixed to an upper surface of distal end portion 342 in a pair in the left-right direction.

In the present embodiment, alignment member 50 is exchangeably attached to track member 34. Alignment member 50 has multiple cavities 51 that individually accommodate multiple components 92. Specifically, multiple cavities 51 are arranged in a matrix in supply region As. For example, alignment member 50 has a total of 80 cavities 51 that are regularly arranged 8 in the conveyance direction and 10 in the width direction of conveyance path R, respectively. Each of multiple cavities 51 is opened upward to accommodate component 92 in a posture in which a thickness direction of component 92 is in the up-down direction.

The opening of cavity 51 is set to a dimension slightly larger than an outer shape of component 92 in an upward view. The depth of cavity 51 is set according to the type (shape, mass, or the like) of component 92. One selected from various types of track members 34 based on the type of component 92, the required number of cavities 51, and the functionality is attached.

Here, "supply region As" of track member 34 is a region for supplying component 92 in a bulk state, and is a region from which component 92 can be collected by suction nozzle 134 supported by mounting head 133. In addition, "conveyance path R" of track member 34 is a path of component 92 through which component 92 flowed from receiving region Ar to track member 34 is conveyed to supply region As.

Bulk feeder 30 includes cover 36. Cover 36 is fixed to track member 34 and covers an upper portion of conveyance path R. Cover 36 has multiple exhaust ports 361 formed on an upper surface thereof. A mesh having a joint smaller than an outer dimension of component 92 is stretched over exhaust port 361. According to such a configuration, cover 36 is configured to be able to discharge air from exhaust port 361 to the outside while preventing component 92 from protruding from conveyance path R.

Bulk feeder 30 includes shutter 37 provided above track member 34 and capable of closing an opening of supply region As. By opening or closing shutter 37, bulk feeder 30 can prevent component 92 from protruding and foreign matters from entering supply region As. In the present embodiment, shutter 37 is switched between an open state, a closed state, and an intermediate state by the opening/closing operation. The closed state of shutter 37 is a state in which shutter 37 contacts track member 34 and the opening of supply region As is completely closed. At this time, as indicated by dashed lines in FIG. 4, shutter 37 is located behind feeder main body 31 with respect to pair of reference marks 344 of track member 34, so that pair of reference marks 344 can be visually recognized and imaged in the upward view.

The open state of shutter 37 is a state in which the opening of supply region As is not closed and a principal range (a range in which multiple cavities 51 are provided in the present embodiment) of supply region As is exposed. At this time, suction nozzle 134 can execute the collection operation of component 92 with respect to any of cavities 51. The intermediate state of shutter 37 is a state between the closed state and the open state in which shutter 37 is separated from track member 34 by at least the amplitude of track member 34 vibrated by the excitation of excitation device 40, and restricts the protruding of component 92 from the opening of supply region As. Shutter 37 is opened or closed by a driving device (not illustrated), and is brought into the closed state, the open state, and the intermediate state according to a driving state of the driving device.

Track member 34 is formed with a flow path of component 92 extending downward at a rear portion thereof, and has introduction portion 343 through which the flow path opens downward. Introduction portion 343 faces feed-out section 322 of receiving member 32 in the up-down direction. Bulk feeder 30 includes tubular connection member 38. Connection member 38 connects feed-out section 322 of receiving member 32 and introduction portion 343 of track member 34. In the present embodiment, connection member 38 is a tight coil spring and has flexibility as a whole.

According to the configuration as described above, connection member 38 connects multiple components 92 so as to be able to flow between receiving region Ar and conveyance path R. In addition, connection member 38 absorbs the vibration by being deformed according to the vibration of receiving member 32 and the vibration of track member 34 with respect to feeder main body 31. Connection member 38 alleviates or blocks vibration transmitted between receiving member 32 and track member 34 that vibrate independently of each other.

2-5. Air Supply Device 39

Bulk feeder 30 includes air supply device 39. Air supply device 39 supplies positive pressure air from a lower side of receiving region Ar, so that multiple components 92 are caused to flow from receiving member 32 to track member 34 via connection member 38. In the present embodiment, air supply device 39 supplies or blocks the positive pressure air supplied from the outside from a lower side of receiving region Ar based on a command of feeder control device 60 described later.

When air supply device 39 supplies the positive pressure air, multiple components 92 staying in receiving region Ar are blown upward by the positive pressure air. The positive pressure air and multiple components 92 flow in this order through feed-out section 322 of receiving member 32, connection member 38, and introduction portion 343, and reach conveyance path R of track member 34. Here, the positive pressure air is exhausted to the outside from exhaust port 361 of cover 36. In addition, multiple components 92 fall into conveyance path R of track member 34 by their own weights.

2-6. Excitation Device 40

Bulk feeder 30 includes excitation device 40 provided in feeder main body 31. Excitation device 40 applies vibration to track member 34 so that multiple components 92 are conveyed along conveyance path R. Specifically, excitation device 40 includes multiple support members 41, multiple piezoelectric elements 42, vibration sensor 43, and power supply device 44. Multiple support members 41 directly or indirectly connect feeder main body 31 and bracket 33 to support bracket 33.

In the present embodiment, multiple support members 41 include forward movement support member 41A used for forward conveyance of component 92 and rearward movement support member 41B used for rearward conveyance. The inclination directions of forward movement support member 41A and rearward movement support member 41B with respect to the vertical direction are different from each other. Multiple piezoelectric elements 42 are vibrators that vibrate at a frequency corresponding to power supplied from power supply device 44. Multiple piezoelectric elements 42 are attached to multiple support members 41, respectively.

When at least some of multiple piezoelectric elements 42 vibrate, vibration is applied to track member 34 via bracket 33. In addition, the amplitude of track member 34 changes according to the voltage applied to piezoelectric element 42. Vibration sensor 43 detects a vibration value indicating a vibration state of track member 34 vibrated by the excitation of excitation device 40. As the vibration value indicating the vibration state, an amplitude, a frequency, a decay time, a vibration trajectory (a movement trajectory of a specific portion accompanying the vibration), and the like can be applied. In the present embodiment, vibration sensor 43 detects the frequency or the amplitude of the actual vibration of track member 34 when power is supplied to piezoelectric element 42 so that piezoelectric element 42 is vibrated.

In the present embodiment, vibration sensor 43 is provided in each of multiple support members 41 that support bracket 33 that vibrates integrally with track member 34. More specifically, piezoelectric element 42 and vibration sensor 43 are provided in each of forward movement support member 41A and rearward movement support member 41B. Vibration sensor 43 provided in forward movement support member 41A detects the actual frequency or amplitude as the vibration value when piezoelectric element 42 provided in forward movement support member 41A is supplied with power and applies vibration to track member 34 via bracket 33.

Here, when excitation device 40 applies vibration to track member 34, track member 34 makes an elliptical motion in the side view. As a result, an external force of a front side and an upper side, or an external force of a rear side and an upper side is applied to multiple components 92 in conveyance path R according to the rotational direction of the elliptical motion of track member 34. As a result, multiple components 92 are conveyed to the front side or the rear side of track member 34.

Power supply device 44 changes the frequency and the applied voltage of the power to be supplied to piezoelectric element 42 based on a command from feeder control device 60 described later. As a result, the frequency and the amplitude of the vibration applied to track member 34 are adjusted, so that the rotational direction of the elliptical motion of track member 34 is determined. When the frequency or amplitude of the vibration of track member 34 and the rotational direction of the elliptical motion caused by the vibration change, a conveyance speed of component 92 to be conveyed, a degree of dispersion of component 92, a conveyance direction, and the like change.

Therefore, in order to improve conveyance efficiency, excitation device 40 sets in advance power supply (frequency, applied voltage) corresponding to vibration characteristics (including the natural frequency) having individual differences. For example, bulk feeder 30 executes the calibration processing in a state in which track member 34 used for a supply operation to be executed is attached, that is, in a state in which track member 34 is locked by lock unit 35 with respect to bracket 33. Details of the above-described calibration processing will be described later.

2-7. Feeder Control Device 60

Bulk feeder 30 includes feeder control device 60. Feeder control device 60 mainly includes a CPU, various memories, and a control circuit. Feeder control device 60 is powered via connector 311 in a state in which bulk feeder 30 is set in slot 121, and is placed in a state capable of communicating with control device 16 of component mounter 10.

As illustrated in FIG. 2, feeder control device 60 includes storage section 61. Storage section 61 includes a flash memory or the like. Storage section 61 stores various data such as a program and a conveyance parameter used for controlling the component supplying process. The above-mentioned "conveyance parameter" is a parameter for controlling the operation of excitation device 40 so that the vibration applied to track member 34 is appropriate when component 92 is conveyed in the component supplying process, and is set in advance in association with each type of component 92, for example.

Feeder control device 60 includes excitation control section 62. Excitation control section 62 controls the operation of excitation device 40 so as to execute the conveying operation of component 92. Specifically, excitation control section 62 sends a command to power supply device 44 of excitation device 40 when executing the conveying operation. As a result, power supply device 44 supplies predetermined power to piezoelectric element 42, so that vibration is applied to track member 34 via bracket 33. Then, component 92 on conveyance path R is conveyed by receiving an external force so as to move in the conveyance direction.

According to the configuration of bulk feeder 30 as described above, by detecting the vibration value indicating the actual vibration state of the excited track member 34, it is possible to acquire useful information relating to the actual supply operation in bulk feeder 30. This vibration value can be used for diagnosing whether bulk feeder 30 is performing the intended operation, and can be used for specifying the frequency of the vibration to be applied to track member 34 in order to perform an efficient supply operation, as described below. Furthermore, the vibration value can be used in the calibration processing of bulk feeder 30 executed in order to accommodate the change of the vibration environment. Details of each processing will be described later.

3. Configuration of Component Supply Control System 80

Figure 5:
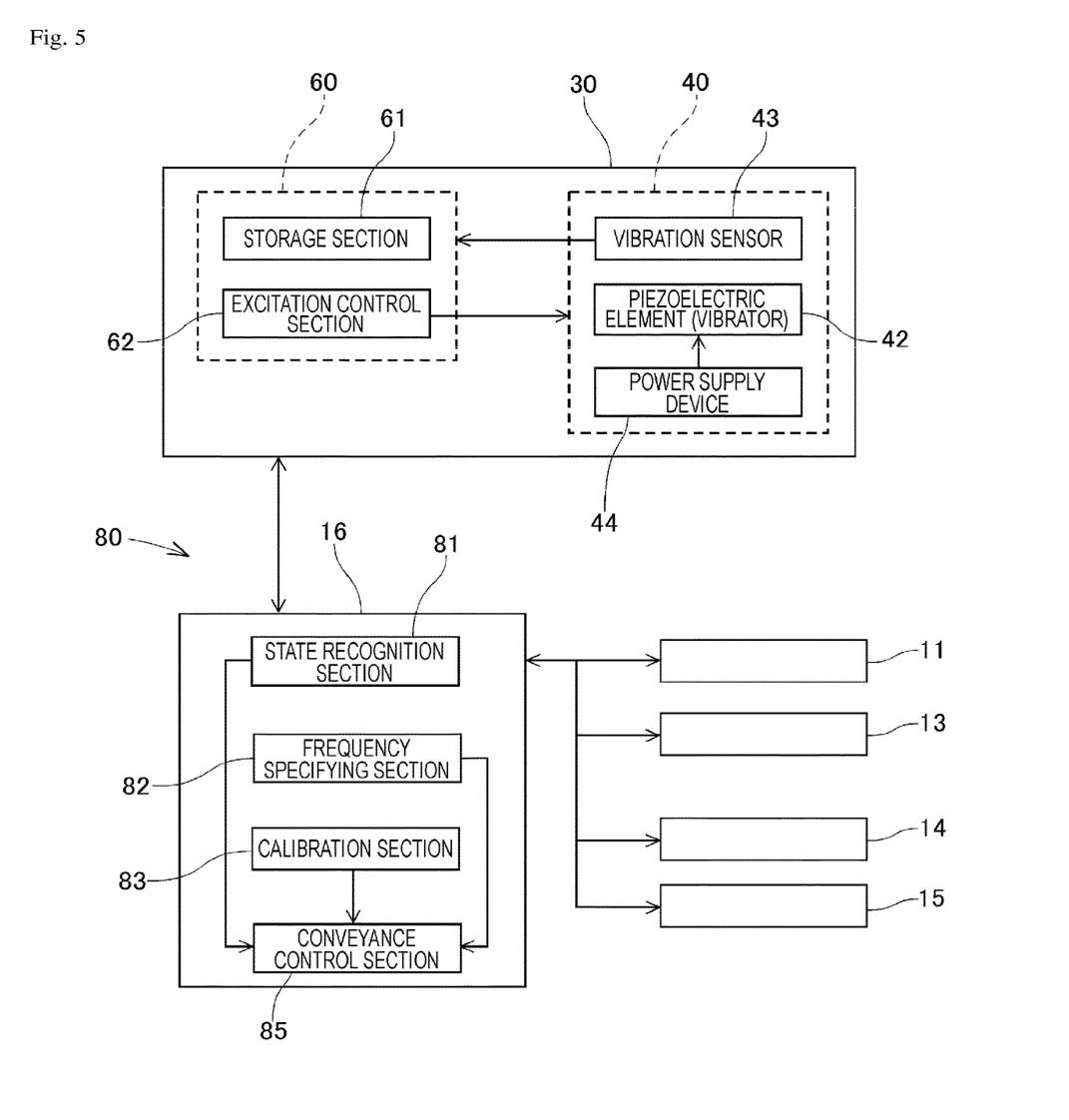
FIG. 5 is a block diagram illustrating a component mounter to which a component supply control system is applied.

Component supply control system 80 controls the component supply using bulk feeder 30. In the present embodiment, as illustrated in FIG. 5, component supply control system 80 is configured to communicate with bulk feeder 30 incorporated in control device 16 and provided in slot 121. Component supply control system 80 controls the component supply in order to maintain a good supply state of component 92 in bulk feeder 30.

3-1. State Recognition Section 81

As illustrated in FIG. 5, component supply control system 80 includes state recognition section 81. As described above, state recognition section 81 recognizes the supply state of multiple components 92 in supply region As of bulk feeder 30 based on the image data acquired by imaging board camera 15. More specifically, state recognition section 81 first executes recognition processing of the supply state based on the image data acquired by imaging supply region As in a state in which bulk feeder 30 conveys multiple components 92 to supply region As by vibration.

In supply region As, there may be a large number of components 92 in a bulk state, such as those accommodated in a normal posture in cavity 51, those outside cavity 51, those contacting or depositing on each other, and those in a horizontal posture. State recognition section 81 recognizes, for each of individual components 92 recognized by the image processing, the supply state as to whether component 92 can be collected. Alternatively, state recognition section 81 recognizes the supply state for each of multiple cavities 51.

The "supply state" includes a state in which component 92 is present in cavity 51 and can be collected, a state in which component 92 is present in cavity 51 and cannot be collected, and a state in which component 92 is not present in cavity 51. Here, in supply region As, a component group in which multiple components 92 are densified may be formed due to, for example, excessively conveying component 92 with respect to the number of cavities 51. State recognition section 81 may further determine the position and the size of the component group as the component group state based on the image data.

3-2. Frequency Specifying Section 82

As illustrated in FIG. 5, component supply control system 80 includes frequency specifying section 82. Frequency specifying section 82 specifies the natural frequency of the vibrating body including track member 34 based on the result detected by vibration sensor 43. Here, the vibrating body is an assembly of members that vibrate integrally with track member 34 by excitation by generated excitation device 40. In the present embodiment, the vibrating body includes track member 34, bracket 33, lock unit 35, and cover 36.

Here, the "natural frequency" in the present specification is a frequency assuming an assembled state in which the vibrating body is supported by support member 41 and in contact with another member such as connection member 38, and corresponds to a frequency at which resonance is generated by an external force (excitation by excitation device 40). In the present embodiment, frequency specifying section 82 causes excitation device 40 to apply vibrations of multiple types of frequencies different from each other to the track members 34, respectively, and sets the frequency at which the amplitude of track member 34 detected by vibration sensor 43 becomes maximum as the natural frequency.

Figure 6:
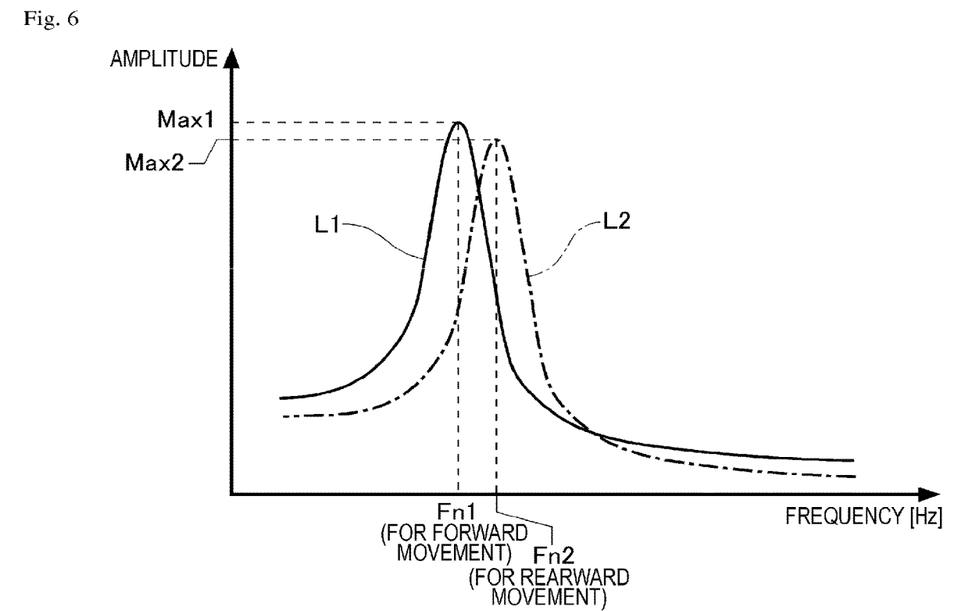
FIG. 6 is a graph illustrating a relationship between a frequency and an amplitude of a vibrating body.

The vibrating body when excitation device 40 applies vibration resonates at the above-described natural frequency in a vibration environment including such a resistance force although being subjected to a reaction from connection member 38, for example. Curves L1 and L2 in FIG. 6 illustrate the relationship between the frequency of the vibration applied by excitation device 40 and the amplitude of the actual vibration of track member 34. For example, as illustrated in curve L1 in FIG. 6, the vibration of track member 34 is set to maximum amplitude Max1 at predetermined frequency Fn1.

In the present embodiment, frequency specifying section 82 first applies vibrations of multiple types of frequencies different from each other to track member 34 (vibrating body). The multiple types of frequencies may be frequencies obtained by equally dividing a predetermined frequency band by a predefined number, or may be frequencies obtained by adding or subtracting a predetermined number of times with respect to a design frequency. Frequency specifying section 82 acquires the amplitude of track member 34 to which the vibration of each frequency is applied, and sets the frequency Fn1 vibrated at maximum amplitude Max1 as the natural frequency. The frequency is a frequency for generating resonance in the vibrating body in the current vibrating environment.

It should be noted that the natural frequency may change over a number of Hz depending on a change in the structure of the member (connection member 38 or the like) in contact with the vibrating body and excitation device 40. Specifically, excitation device 40 exemplified in the present embodiment has forward movement support member 41A used for the forward conveyance and rearward movement support member 41B used for the rearward conveyance, supplies power to the piezoelectric elements 42 provided in each of them, and excites the same. Therefore, for example, since rearward movement support member 41B is a member in contact with bracket 33, it affects the vibration of the vibrating body during the forward conveyance.

Curves L1 and L2 in FIG. 6 indicate that the natural frequencies (frequencies Fn1 and Fn2) of the vibrating bodies are different between the forward conveyance and the rearward conveyance. In addition, in a case where the configurations of the respective vibrating bodies are substantially different from each other, as illustrated in FIG. 6, maximum amplitudes Max1 and Max2 of the vibrating bodies at respective natural frequencies (frequencies Fn1 and Fn2) may be different from each other. Therefore, in the present embodiment, frequency specifying section 82 causes excitation device 40 to apply the vibrations corresponding to the forward conveyance and the rearward conveyance to track member 34, respectively, and specifies the two types of natural frequencies (frequencies Fn1 and Fn2) used in the conveying operations of the forward conveyance and the rearward conveyance, respectively.

Here, the natural frequency of the vibrating body may change with the exchange of track member 34 and alignment member 50. Therefore, frequency specifying section 82 may specify the natural frequency of the vibrating body when the power supply is applied to bulk feeder 30, for example. In addition, the natural frequency of the vibrating body may gradually change according to aging change of bulk feeder 30. Therefore, frequency specifying section 82 may specify the natural frequency of the vibrating body when a predetermined time has elapsed from the time when the power supply is applied to bulk feeder 30, or when the conveying operation of component 92 by bulk feeder 30 exceeds a predetermined number of times.

In addition, in the specific processing of the natural frequency, it is necessary to actually apply vibration to track member 34, which may affect the execution of the mounting process in component mounter 10 when executed at any timing. Therefore, frequency specifying section 82 may execute the specific processing of the natural frequency during a rest period of component supply device 12 that does not affect the mounting process. In the present embodiment, frequency specifying section 82 executes at least a portion of the specific processing for specifying the natural frequency during a period in which board 91 is carried in or out of component mounter 10. Frequency specifying section 82 stores the specified natural frequency (for forward movement and rearward movement) of the vibrating body in control device 16.

3-3. Calibration Section 83

As illustrated in FIG. 5, component supply control system 80 includes calibration section 83. Calibration section 83 executes calibration processing for calibrating the operation of excitation device 40. Calibration section 83 adjusts the power supplied to the vibrator (piezoelectric element 42) based on the natural frequency specified by frequency specifying section 82, and acquires the power (in other words, the current value with respect to the applied voltage) supplied to the vibrator (piezoelectric element 42) when track member 34 vibrates at the natural frequency. Calibration section 83 acquires power corresponding to each of the vibrating bodies when the natural frequency of the vibrating body is specified for each of forward movement and rearward movement.

Specifically, calibration section 83 first acquires, from control device 16, the natural frequency as a vibration characteristic when the vibrating body including track member 34 vibrates integrally by the excitation of excitation device 40. Next, calibration section 83 instructs power supply device 44 of excitation device 40 to supply predetermined power to piezoelectric element 42 for a predetermined period of time. As a result, in the above period, the frequency of the actual vibration of track member 34 is measured based on the detected value by vibration sensor 43.

Subsequently, calibration section 83 adjusts the power to piezoelectric element 42 by power supply device 44 based on the frequency as the measurement result with respect to the vibration. At this time, calibration section 83 adjusts the power to piezoelectric element 42 based on the difference between the measured actual frequency and the previously acquired natural frequency. Calibration section 83 acquires the power supplied to piezoelectric element 42 when the vibrating body vibrates at the natural frequency by repeating the measurement and the adjustment as described above.

In addition to the above-described methods, calibration section 83 may instruct that the power supplied for a predetermined period of time be changed stepwise, for example, and compare the frequency measured in each period with a known natural frequency. Calibration section 83 then acquires the power supplied in a period that has reached the frequency closest to the natural frequency. In this manner, calibration section 83 acquires the power necessary for vibrating at the natural frequency in the current configuration of bulk feeder 30.

Calibration section 83 then sets the power as reference power in conveying component 92, to bulk feeder 30 (causes storage section 61 to store the same). As a result, bulk feeder 30 performs control so that power supply device 44 supplies the set reference power to piezoelectric element 42 when performing the conveying operation of component 92 based on an external command. It should be noted that bulk feeder 30 may add predetermined correction or the like to the reference power according to the form of the conveying operation (feeding operation, return operation, or the like).

It should be noted that the natural frequency of the vibrating body is inherent in each bulk feeder 30 as described above, and may change according to track member 34 and alignment member 50 attached to bulk feeder 30. Therefore, it is preferable to perform the above-described specific processing of the natural frequency at least after track member 34 is exchanged. By this specific processing of the natural frequency, the natural frequency of the current bulk feeder 30 is specified, and the power to be supplied is acquired. However, due to other disturbances, the vibrating body sometimes does not vibrate at the specified natural frequency even when the acquired power is supplied.

For example, the vibration state of the vibrating body in bulk feeder 30 changes according to the fixed state of bulk feeder 30 by slot 121. That is, depending on which slot 121 is provided in bulk feeder 30, the actual frequency of the vibrating body may change even when the same power is supplied to piezoelectric element 42. Further, in consideration of that appropriate power may change depending on the operating time of bulk feeder 30 or the like, it is preferable that calibration section 83 executes calibration processing to accommodate a current situation, for example, after a certain period of time elapses or when the power supply is applied.

3-4. Conveyance Control Section 85

As illustrated in FIG. 5, component supply control system 80 includes conveyance control section 85. Conveyance control section 85 controls the conveying operation of component 92 in bulk feeder 30. Here, the conveying operation of component 92 in bulk feeder 30 includes the feeding operation and the return operation. The above-mentioned "feeding operation" is an operation of conveying component 92 from the rear side to the front side of track member 34, and an operation of moving multiple components 92 forward from conveyance path R communicating with supply region As to supply region As side. In addition, the "return operation" is an operation of conveying component 92 from the front side to the rear side of track member 34, and an operation of moving multiple components 92 rearward from supply region As to conveyance path R side.

Conveyance control section 85 controls the number of executions, the execution time, and the like of the feeding operation and the return operation based on the supply state of component 92 in supply region As recognized by state recognition section 81. For example, conveyance control section 85 switches the multiple conveyance patterns in the control of the conveying operation based on the number of components 92 that can be collected in supply region As and the approximate number of components 92 that exist regardless of the availability of the collection in supply region As. The multiple conveyance patterns include a normal conveyance, a provision conveyance, and a removal conveyance.

The above-mentioned "normal conveyance" is a conveyance pattern that executes the feeding operation and the return operation for a predetermined time period. In this normal conveyance, for example, the feeding operation and the return operation may be alternately repeated two or more times. The above-mentioned "provision conveyance" is a conveyance pattern that increases the number of components 92 to be moved forward from the normal conveyance or the execution time of the feeding operation. The above-mentioned "removal conveyance" is a conveyance pattern that reduces the number of components 92 to be moved rearward from the normal conveyance or the execution time of the return operation.

It should be noted that conveyance control section 85 controls the conveying operation of component 92 in bulk feeder 30 based on the result specified by frequency specifying section 82. For example, conveyance control section 85 may designate the conveyance pattern and the frequency (or the power supplied to piezoelectric element 42) when instructing the conveying operation. Alternatively, the result specified by frequency specifying section 82 may be stored in advance in storage section 61 of bulk feeder 30, and conveyance control section 85 may simply designate the conveyance pattern alone. As a result, conveyance control section 85 performs control so that the vibration of the natural frequency specified by frequency specifying section 82 is applied to track member 34 in the conveying operation of component 92 in bulk feeder 30.

4. Feeder Control by Component Supply Control System 80

Component supply control system 80 performs feeder control according to the supply state by bulk feeder 30 during the execution of the mounting process by component mounter 10. The above-described feeder control includes control of the conveying operation and control of the opening/closing operation of shutter 37. Here, after bulk feeder 30 is set in slot 121, control device 16 of component mounter 10 executes the calibration processing to recognize the position of supply region As in the machine.

Specifically, control device 16 first instructs feeder control device 60 to close shutter 37. As a result, multiple reference marks 344 are placed in a state capable of being imaged from the upper side. Control device 16 moves board camera 15 above multiple reference marks 344 of bulk feeder 30, and acquires image data by imaging of board camera 15. Then, control device 16 recognizes the position of bulk feeder 30 in the machine, that is, the position of supply region As, based on the positions of multiple reference marks 344 included in the image data by the image processing and the position of board camera 15 when the image is captured.

Figure 7:
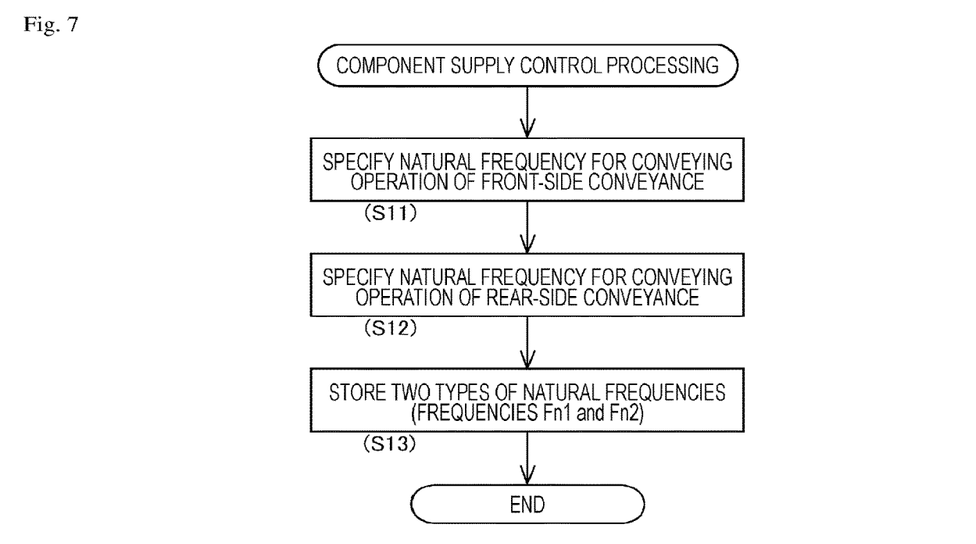
FIG. 7 is a flowchart illustrating component supply control processing.

Subsequently, as illustrated in FIG. 7, frequency specifying section 82 specifies the natural frequency Fn1 used in the conveying operation of the forward conveyance (S11). Thereafter, frequency specifying section 82 specifies the natural frequency Fn2 used for the rearward conveyance (S12). In the specific processing of the natural frequency, for example, vibrations of multiple types of frequencies different from each other by 0.25 Hz from the lower limit to the upper limit of a predetermined frequency band are respectively applied to track member 34. Then, frequency specifying section 82 acquires the amplitude of track member 34 to which the vibration of each frequency is applied, and sets the frequency obtained by vibrating with the maximum amplitude as the natural frequency. Frequency specifying section 82 causes storage section 61 of control device 16 and bulk feeder 30 to store the two types of natural frequencies (for forward movement and rearward movement) of the specified vibrating body (S13).

Frequency specifying section 82 executes specific processing of the natural frequency when power supply is applied to bulk feeder 30 as described above. In addition, frequency specifying section 82 may execute the specific processing of the natural frequency when track member 34 or alignment member 50 is exchanged or when the conveying operation of component 92 by bulk feeder 30 exceeds a predetermined number of times. It should be noted that frequency specifying section 82 may omit the execution of the specific processing of the natural frequency in a case where track member 34 or alignment member 50 is not exchanged while the power is turned off even when the power supply is applied to bulk feeder 30.

Conveyance control section 85 instructs bulk feeder 30 to convey component 92 before collecting component 92 from bulk feeder 30 in the mounting process. As a result, bulk feeder 30 discharges component 92 from component case 70 as required, and causes component 92 to flow to track member 34. Thereafter, bulk feeder 30 maintains shutter 37 in the intermediate state to perform the conveying operation of component 92. As a result, component 92 is accommodated in multiple cavities 51, and excess component 92 is retracted from supply region As to conveyance path R side.

In the recognition processing of the supply state, state recognition section 81 instructs bulk feeder 30 to open shutter 37. State recognition section 81 moves board camera 15 to an upper side of supply region As, and acquires image data by imaging of board camera 15. State recognition section 81 then recognizes the position and angle of component 92 that can be collected as the supply state by image processing for the image data.

Control device 16 instructs bulk feeder 30 to open shutter 37 immediately before executing the collection operation in a PP cycle. In addition, control device 16 instructs bulk feeder 30 to convey component 92 in the set conveyance pattern during the period in which the collection operation is completed and the mounting operation in the PP cycle is executed. Bulk feeder 30 performs the conveying operation of the set conveyance pattern when instructed to convey component 92.

As described above, bulk feeder 30 performs the conveying operation according to the supply state of component 92 in supply region As. As a result, in a state in which component 92 is satisfactorily supplied by initial setting, the normal conveyance is executed, whereas in a case where the number of components 92 that can be collected immediately after the conveying operation is relatively small, the provision conveyance is executed. In this provision conveyance, at the same time, a process for discharging component 92 from component case 70 and flowing multiple components 92 to conveyance path R may be executed in response to a command from conveyance control section 85.

In addition, when the current supply state represents an excessive provision of component 92 or when a component group is present, the removal conveyance is executed. As a result, the number of components 92 in supply region As is appropriately adjusted. Such a conveying operation promotes component 92 to be accommodated in cavity 51 in an appropriate posture, so that the number of components 92 that can be collected in supply region As can be increased. In this manner, by making the supply state of component 92 in bulk feeder 30 favorable, it is possible to improve the productivity of component mounter 10.

State recognition section 81 executes the state recognition processing again after the conveying operation of component 92 by bulk feeder 30 is completed. As a result, the current supply state of supply region As after the conveying operation is recognized. In addition, calibration section 83 executes the calibration processing at a predetermined timing. For example, calibration section 83 executes the calibration processing as necessary after the power supply is applied to bulk feeder 30 and when the execution of the specific processing of the natural frequency is omitted.

Figure 8:
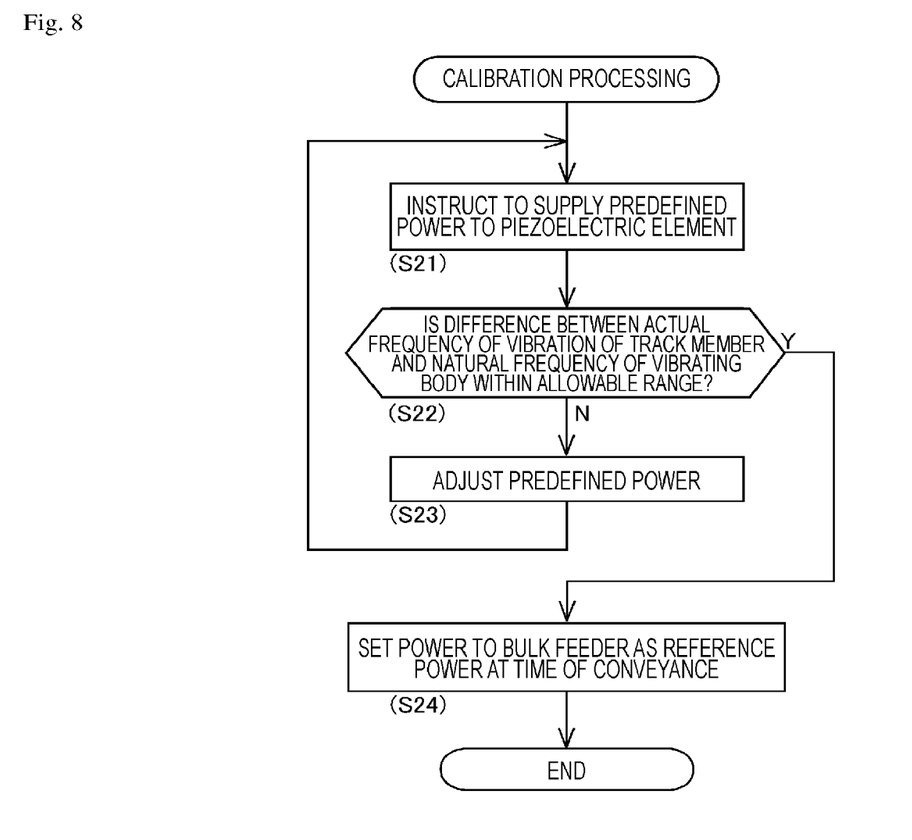
FIG. 8 is a flowchart illustrating calibration processing.

As illustrated in FIG. 8, calibration section 83 instructs power supply device 44 of excitation device 40 to supply predefined power to piezoelectric element 42 for a prescribed period of time (S21). As the predefined power, the reference power is set as an initial value. As a result, vibration is applied to track member 34 in the above period. Next, calibration section 83 determines whether a difference between the actual frequency of vibration of track member 34 measured based on the value detected by vibration sensor 43 and the natural frequency of the vibrating body is within the allowable range (S22).

When the difference is not within the allowable range (S22: No), calibration section 83 adjusts the predefined power to be supplied next by power supply device 44 (S23). Specifically, calibration section 83 sets the reference power to the predefined power by incrementing or decrementing the reference power based on, for example, the magnitude relationship between the natural frequency and the actual frequency. Calibration section 83 repeats the above S21 to S23, and acquires the power supplied to piezoelectric element 42 at that time when the difference between the actual frequency of vibration and the natural frequency of the vibrating body is within the allowable range (S22: Yes).

Calibration section 83 sets the power as the reference power in conveying component 92, to bulk feeder 30 (S24). That is, calibration section 83 causes storage section 61 of bulk feeder 30 to store the power to be supplied to piezoelectric element 42 when applying the vibration at the natural frequency as a result of the calibration. It should be noted that calibration section 83 determines that the calibration processing is necessary and executes the same, for example, when a certain period of time has elapsed from the time of changing slot 121 provided with bulk feeder 30 or from the time of executing the previous calibration processing. The component supply control system ends the above control processing when all the PP cycles to be executed have been completed and the supply of component 92 has become unnecessary.

According to such a configuration of component supply control system 80, the supply state of component 92 in bulk feeder 30 can be improved by controlling the conveying operation based on the natural frequency of the vibrating body including track member 34. Accordingly, it is possible to improve the productivity of component mounter 10 provided with bulk feeder 30.

5. Modification of Embodiment

5-1. Component Supply Control System 80

In the embodiment, each of the sections 81 to 83 and 85 (state recognition section 81, frequency specifying section 82, calibration section 83, and conveyance control section 85) of component supply control system 80 has been described by exemplifying the configuration to be incorporated in control device 16 of component mounter 10. Meanwhile, some or all of sections 81 to 83 and 85 may be configured to be incorporated in an external device of control device 16. For example, state recognition section 81 may be integrally movably provided on the moving body 132 and may be incorporated in an imaging unit that controls the imaging operation of board camera 15.

In addition, frequency specifying section 82, calibration section 83, and conveyance control section 85 may be incorporated in component supply device 12 that mediates communication between feeder 122 provided in multiple slots 121 and control device 16. In addition, each of the sections 81 to 83 and 85 may be incorporated in feeder control device 60 of bulk feeder 30 as the self-control function of bulk feeder 30. Further, each of the sections 81 to 83 and 85 may be incorporated in a host computer, a dedicated device, or the like that is communicably connected to component mounter 10. Either aspect exhibits the same effects as those of the embodiment.

It should be noted that component supply control system 80 may have a configuration without calibration section 83. In such an aspect, frequency specifying section 82 executes processing for specifying the natural frequency of the vibrating body at a timing at which the calibration processing by calibration section 83 is executed as illustrated in the embodiment. As a result, it is possible to acquire the natural frequency and the power to be supplied to piezoelectric element 42 (vibrator) in the current situation. However, in a case where there is no or few elements of change in the natural frequency such as a change in slot 121, the configuration including calibration section 83 is preferable to be able to execute the calibration processing as exemplified in the embodiment.

5-2. Vibration Sensor 43 and Frequency Specifying Section 82

In the embodiment, vibration sensor 43 is configured to detect the actual frequency or the amplitude as a vibration value. Vibration sensor 43 outputs an electrical signal corresponding to an external force. Accordingly, by analyzing the electrical signal, the actual frequency and amplitude can be measured. Meanwhile, in addition to the configuration described above, vibration sensor 43 may be, for example, a displacement meter for measuring a displacement amount of vibrating track member 34.

In the above-described aspect, frequency specifying section 82 may acquire the frequency and the amplitude of track member 34 by analyzing the displacement amount of track member 34 measured by vibration sensor 43 and a temporal change of the displacement amount. In addition, frequency specifying section 82 may specify the natural frequency of the vibrating body based on a difference in the decay time of the vibration from the time when the power supply to piezoelectric element 42 is interrupted to the time when track member 34 is stopped, and the movement trajectory of a specific portion of track member 34 to which the vibration is applied, for each of the multiple types of frequencies.

5-3. Track Member 34

In the embodiment, track member 34 of bulk feeder 30 includes alignment member 50 having multiple cavities 51 formed therein. Meanwhile, a configuration may be adopted in which alignment member 50 is omitted. That is, in supply region As of track member 34, a recessed portion in which component 92 is dispersed at a position lower than the upper surface of conveyance path R, or a planar portion uniform with the upper surface of conveyance path R may be formed, so that component 92 is supplied in the bulk state. It should be noted that, from the viewpoint of improving the efficiency of the component supplying process or reducing the load of the image processing in the recognition processing of the supply state in supply region As, the configuration described in the embodiment is preferable.

REFERENCE SIGNS LIST

10: component mounter, 12: component supply device, 13: component transfer device, 15: board camera, 16: control device, 30: bulk feeder, 31: feeder main body, 34: track member, 40: excitation device, 41: support member, 41A: forward movement support member, 41B: rearward movement support member, 42: piezoelectric element (vibrator), 43: vibration sensor, 44: power supply device, 50: alignment member, 51: cavity, 60: feeder control device, 80: component supply control system, 81: state recognition section, 82: frequency specifying section, 83: calibration section, 85 conveyance control section, 91: board, 92: component, As: supply region, R: conveyance path

The invention claimed is:

1. A component supply control system comprising:
a bulk feeder comprising:
a feeder main body,
a track member provided vibratably with respect to the feeder main body and formed with a conveyance path through which multiple components are conveyed,
an excitation device configured to apply vibration to the track member so that the multiple components are conveyed along the conveyance path, and
a vibration sensor configured to detect a vibration value indicating a vibration state of the track member that vibrates by the excitation of the excitation device;
a frequency specifying section configured to specify a natural frequency of a vibrating body including the track member based on a result detected by the vibration sensor; and
a conveyance control section configured to control a conveying operation of the component in the bulk feeder based on a result specified by the frequency specifying section.

2. The component supply control system according to claim 1, wherein the excitation device includes a support member configured to support the track member and a vibrator provided in the support member and configured to vibrate according to power supplied thereto, the vibration sensor is provided in the support member and detects an amplitude of an actual vibration of the track member as the vibration value, and
the frequency specifying section causes the excitation device to apply vibrations of multiple types of frequencies different from each other to the track member, respectively, and sets a number of vibrations when the amplitude of the track member detected by the vibration sensor becomes maximum as the natural frequency.

3. The component supply control system according to claim 2, wherein the support member includes a forward movement support member used for forward conveyance for conveying the component to a front side of the conveyance path and a rearward movement support member used for rearward conveyance for conveying the component to a rear side of the conveyance path,
the vibrator and the vibration sensor are provided in each of the forward movement support member and the rearward movement support member, and
the frequency specifying section causes the excitation device to apply vibrations corresponding to the front-side conveyance and the rear-side conveyance to the track member, respectively, and specifies two types of natural frequencies used in conveying operations of the front-side conveyance and the rear-side conveyance, respectively.

4. The component supply control system according to claim 2, further comprising a calibration section configured to adjust power supplied to the vibrator based on the natural frequency specified by the frequency specifying section and acquire power supplied to the vibrator when the track member vibrates at the natural frequency.

5. The component supply control system according to claim 1, wherein when a power supply is applied to the bulk feeder, when a predetermined time elapses from a time when the power supply is applied to the bulk feeder, or when the conveying operation of the component by the bulk feeder exceeds a predetermined number of times, the frequency specifying section specifies the natural frequency.

6. The component supply control system according to claim 1, wherein the frequency specifying section executes at least some of specific processing for specifying the natural frequency during a period in which a board is carried in or out of a component mounter for mounting the component supplied by the bulk feeder on the board.

7. The component supply control system according to claim 1, wherein the conveyance control section performs control such that a vibration of the natural frequency specified by the frequency specifying section is applied to the track member, in the conveying operation of the component in the bulk feeder.

8. The component supply control system according to claim 1, wherein the excitation device includes a support member configured to support the track member, and a vibrator provided in the support member and configured to vibrate according to power supplied thereto, and
the vibration sensor is provided in the support member, and detects a frequency or an amplitude of an actual vibration of the track member as the vibration value.

* * * * *